(12) United States Patent
Quimby et al.

(10) Patent No.: US 6,424,186 B1
(45) Date of Patent: Jul. 23, 2002

(54) CIRCUIT FOR DYNAMIC SIGNAL DRIVE STRENGTH COMPENSATION

(75) Inventors: Michael S. Quimby; Bruce A. Loyer, both of Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/865,997

(22) Filed: May 25, 2001

(51) Int. Cl.$^7$ ................................................ H03K 3/00
(52) U.S. Cl. ...................................... 327/108; 327/112
(58) Field of Search ............................. 326/82, 83, 84, 326/85, 86, 87; 327/108, 112, 114, 118

(56) References Cited

U.S. PATENT DOCUMENTS

| | | | | |
|---|---|---|---|---|
| 4,638,187 A | * | 1/1987 | Boler et al. | 326/27 |
| 5,021,684 A | * | 6/1991 | Ahuja et al. | 326/27 |
| 5,777,497 A | * | 7/1998 | Han | 327/108 |
| 6,177,810 B1 | | 1/2001 | Loeffler | 326/87 |
| 6,262,606 B1 | | 7/2001 | Tamjidi | 327/108 |
| 6,323,687 B1 | * | 11/2001 | Yano | 326/83 |

* cited by examiner

Primary Examiner—Tuan T. Lam
Assistant Examiner—Hiep Nguyen
(74) Attorney, Agent, or Firm—Conley, Rose & Tayon, PC; B. Noël Kivlin

(57) ABSTRACT

A circuit for dynamic signal drive strength compensation. A circuit for compensating the drive strength of an output signal includes an output driver stage including a driver circuit and a drive strength control circuit. The driver circuit may be selectively enabled depending upon a drive strength indicator signal. The driver circuit includes a P-channel transistor which has a P input which is controlled by a P-channel control signal. The driver circuit also includes an N-channel transistor which has an N input which is controlled by an N-channel control signal. The drive strength control circuit may generate the respective P-channel and N-channel control signals. The P-channel control signal is prevented from changing while the P-channel transistor is turned on. The N-channel control signal is prevented from changing while the N-channel transistor is turned on.

21 Claims, 3 Drawing Sheets

US 6,424,186 B1

CIRCUIT FOR DYNAMIC SIGNAL DRIVE STRENGTH COMPENSATION

BACKGROUND OF THE INVENTION

1. Field of the Invention

This invention relates to integrated circuit output signals and, more particularly, to output signal drive strength compensation.

2. Description of the Related Art

Integrated circuit parameters may vary with factors such as temperature, voltage and frequency. One circuit parameter of interest is the drive strength of an output driver stage. The output drive strength of a signal is typically matched to the circuit that is being driven. For example, a signal trace that is on a circuit board may have an intrinsic impedance associated with it. In some cases, a board designer may place a resistor that matches the impedance of the trace in series with the output driver and the device receiving the signal. This may provide a way to minimize any excess drive current in the circuit. Thus, integrated circuit designers may try to match the output impedance by designing resistive circuits in the circuit pad with the correct impedance.

In a static environment, this design practice may work. However, as mentioned above, circuit parameters such as resistors on an integrated circuit, may vary with temperature. Thus if the resistive circuits in the output pad change, signal degradation may result. This degradation may be more pronounced at higher frequencies. Therefore, it may be necessary to provide a mechanism to compensate the drive strength of the output driver circuits in an integrated circuit.

There may be many ways to compensate the drive strength of an output driver. Some compensation mechanisms inhibit or stop the output signal while the drive strength is modified. This may work unless it is undesirable to stop the signal to wait for the drive strength to change. Other compensation mechanisms may change the drive strength while the signal is being output. Depending on the signal, this may cause undesirable glitches in the output signal. Thus another method of compensating the drive strength of an output driver may be desirable.

SUMMARY OF THE INVENTION

Various embodiments of a circuit for dynamic signal drive strength compensation are disclosed. In one embodiment, a circuit for compensating the drive strength of an output signal includes an output driver stage including a driver circuit and a drive strength control circuit. The driver circuit may be selectively enabled depending upon a drive strength indicator signal. The driver circuit includes a P-channel transistor which has a P input which is controlled by a P-channel control signal. The driver circuit also includes an N-channel transistor which has an N input which is controlled by an N-channel control signal. The drive strength control circuit may generate the respective P-channel and N-channel control signals. The P-channel control signal is dependent upon an input signal and a P-channel enable signal and the N-channel control signal is dependent upon the input signal and an N-channel enable signal. The P-channel enable signal is dependent upon the drive strength indicator signal and the P-channel control signal is prevented from changing while the P-channel transistor is turned on. The N-channel enable signal is dependent upon the drive strength indicator signal and the N-channel control signal is prevented from changing while the N-channel transistor is turned on.

In one particular implementation, the output driver stage further includes a plurality of additional driver circuits. Each of the plurality of additional driver circuits is coupled in parallel to the driver circuit and includes a P-channel transistor and an N-channel transistor. Each of the plurality of additional driver circuits may also be selectively enabled depending upon the drive strength indicator signal. The plurality of additional P-channel transistors is controlled by a plurality of additional P-channel control signals and the plurality of additional N-channel transistors is controlled by a plurality of additional N-channel control signals.

The drive strength control circuit may further generate the plurality of additional P-channel and N-channel control signals. The plurality of additional P-channel control signals are prevented from changing while the plurality of additional P-channel transistors are turned on and the plurality of additional N-channel control signals are prevented from changing while the plurality of additional N-channel transistors are turned on.

Figure 1:
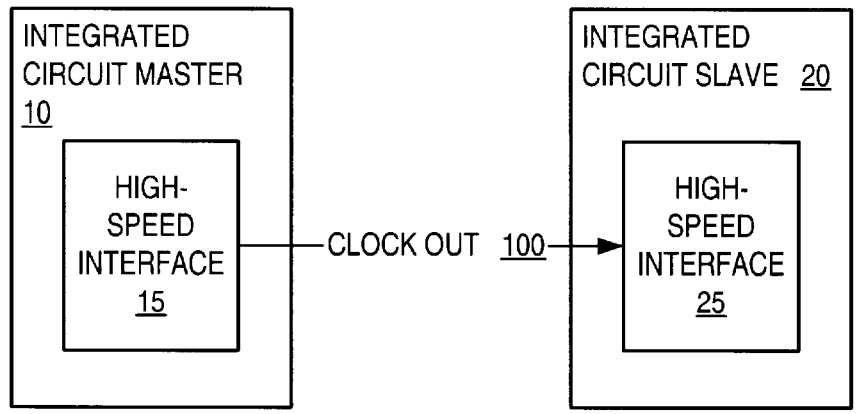
FIG. 1 is a block diagram of one embodiment of a high-speed interface between a master integrated circuit and slave integrated.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of a high-speed interface between a master integrated circuit and slave integrated circuit is shown. An integrated circuit master 10 includes a high-speed interface 15. Integrated circuit slave 20 also includes a high-speed interface 25. High-speed interface 25 is coupled to receive a clock out signal 100 provided by high-speed interface 15.

As described above, high-speed interfaces may require the ability to dynamically change the drive strength of the output driver. In the illustrated embodiment, the output signal is clock out signal 100. As will be described below in greater detail, the output drive strength of an output driver of an integrated circuit may be dynamically changed particularly when the output signal is a clock signal.

Figure 2:
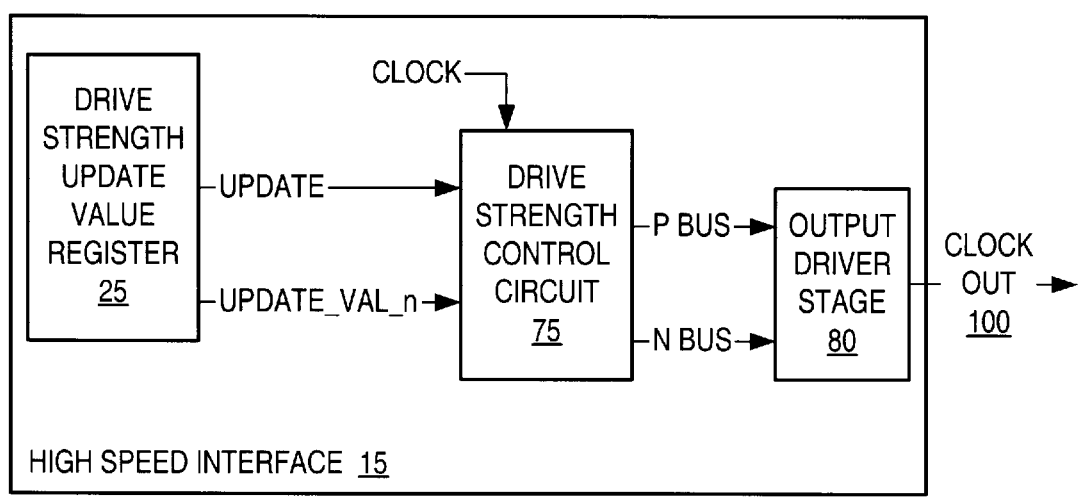
FIG. 2 is a block diagram of one embodiment of a high-speed interface.

Referring to FIG. 2, a block diagram of one embodiment of a high-speed interface is shown. Circuit components that correspond to those shown in FIG. 1 are numbered identically for simplicity and clarity. High-speed interface 15 includes a drive strength update value register 25 coupled to a drive strength control circuit 75 and an output driver stage 80.

In one embodiment, drive strength control circuit 75 receives an Update signal 95 from drive strength update register 35 and a clock signal 90 from clock circuitry (not shown) within high-speed interface 15. Drive strength update register 35 also provides a drive strength update value to drive strength control circuit 75. Output driver stage 80 receives control signals from drive strength control circuit 75 on a Pbus and an Nbus. As will be described in greater detail below, output driver stage 80 may provide clock out signal 100 with a varying output drive strength depending on control signals received from drive strength control circuit 75.

Figure 3:
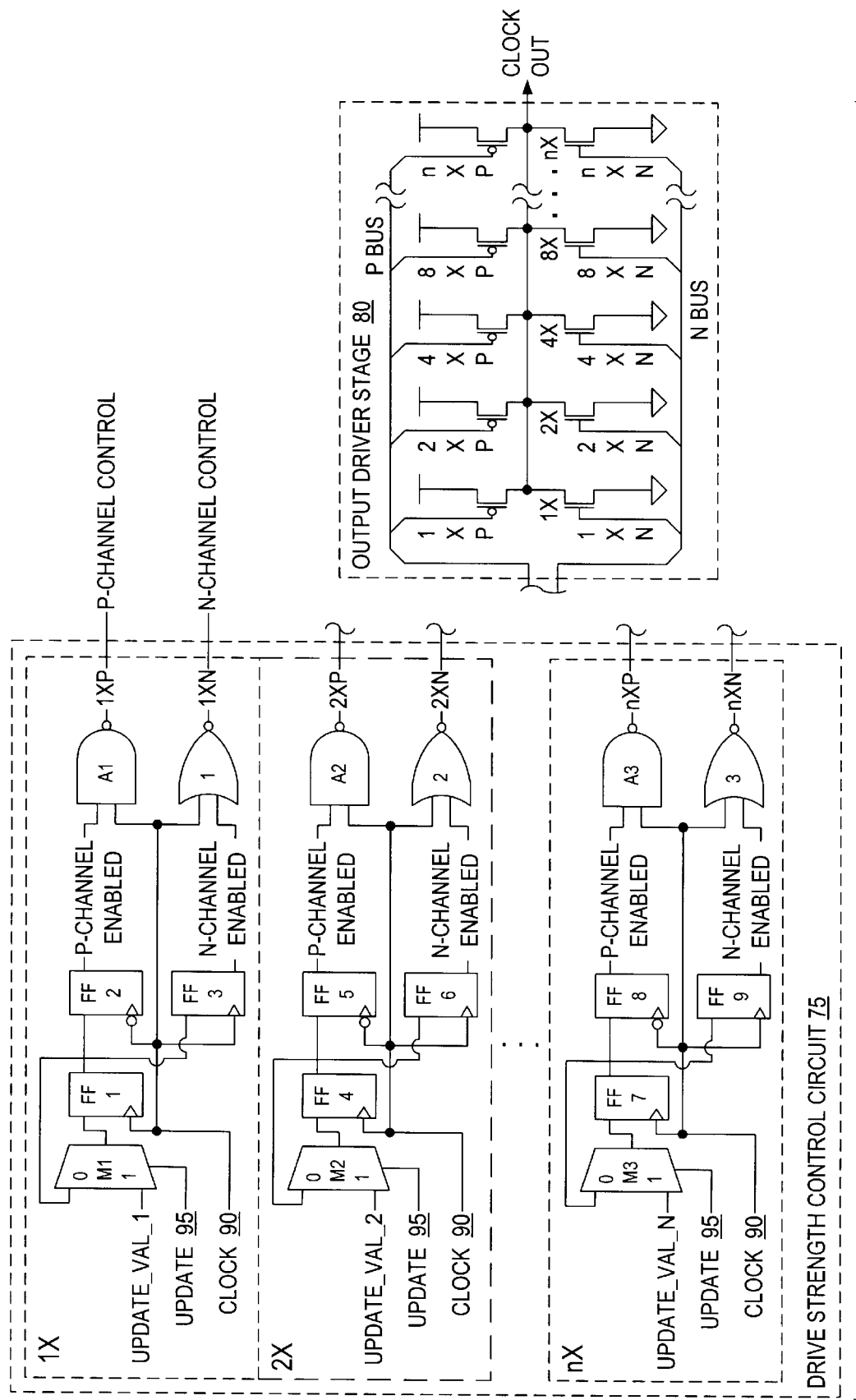
FIG. 3 is a schematic diagram of one embodiment of the drive strength control circuit and the output driver stage of FIG. 2.

Turning to FIG. 3, a schematic diagram of one embodiment of the drive strength control circuit and the output driver stage of FIG. 2 is shown. Circuit components that correspond to those shown in FIG. 2 are numbered identically for simplicity and clarity. Output driver stage 80 includes complimentary metal oxide semiconductor (CMOS) driver circuits which may be connected together in parallel. Each driver circuit has a P-channel and an N-channel transistor which may be individually controlled by a control signal.

Drive strength control circuit 75 includes control circuitry which may selectively enable the driver circuits in output driver stage 80 by providing control signals which depend on drive strength update values provided by drive strength update register 35 of FIG. 2. In FIG. 3, each driver circuit in output driver stage 80 may have a corresponding control circuit in drive strength control circuit 75.

In the illustrated embodiment, the driver circuits in output driver stage 80 are labeled 1X, 2X, 4X, 8X and nX. As used herein, the nX driver is representative of any number of additional driver circuits. It is contemplated that the driver circuits may be sized such that they form a binary weighted configuration. However, any suitable driver sizing may be used. Each of the P-channel gates is routed to a Pbus and each of the N-channel gates is routed to an Nbus. The N-channel gates are labeled 1XN, 2XN, 4XN, 8XN and nXN, respectively. The P-channel gates are labeled 1XP, 2XP, 4XP, 8XP and nXP, respectively.

The corresponding control circuits in drive strength control circuit 75 have control outputs connected to output driver stage 80. Each control circuit has a P-channel control and an N-channel control and the controls are labeled 1XP, 1XN, 2XP, 2XN, nXP and nXN. It is noted that for simplicity, only three control circuits are shown, however it is contemplated that any number of additional driver control circuits may be used to control a corresponding number of driver circuits. It is also noted that in the simplest case one driver circuit and one corresponding driver control circuit may be used. Thus, the circuitry and operation of the 1X driver control circuit will be described.

In the illustrated embodiment, driver control circuit 1X includes a 2-input multiplexer M1. Multiplexer M1 receives an update_val_1 signal at the one input and a latched version of the same signal at its zero input. Multiplexer M1 is controlled by Update signal 95. Both Update signal 95 and the update_val_1 signals are received from drive strength update register 35 of FIG. 2. In FIG. 3, the output of multiplexer M1 is provided to the input of flip-flop FF1. Flip-flop FF1 is clocked on the rising edge of clock signal 90. The output of FF1 is fed back to the zero input of multiplexer M1 as described above. The output of FF1 is also provided to the input of flip-flop FF2 and the input of flip-flop FF3. Flip-flops FF2 and FF3 are both clocked by clock 90. Although FF2 is clocked on the falling edge of clock 90 and FF3 is clocked on the rising edge of clock 90. The output of FF2 is P-channel enable_1 and is provided to one input of a 2-input NAND-gate A1. The inverted output of FF3 is N-channel enable_1 and is provided to one input of a 2-input NOR-gate N1. The other input of A1 and N1 is clock 90. The output of A1 is P-channel control signal 1XP. The output of N1 is the N-channel control signal 1XN. As will be described further below in conjunction with the description of FIG. 4, update_val_1 may cause driver circuit 1X to be enabled or disabled during that portion of a clock cycle when the P-channel and the N-channel transistor are normally off.

Figure 4:
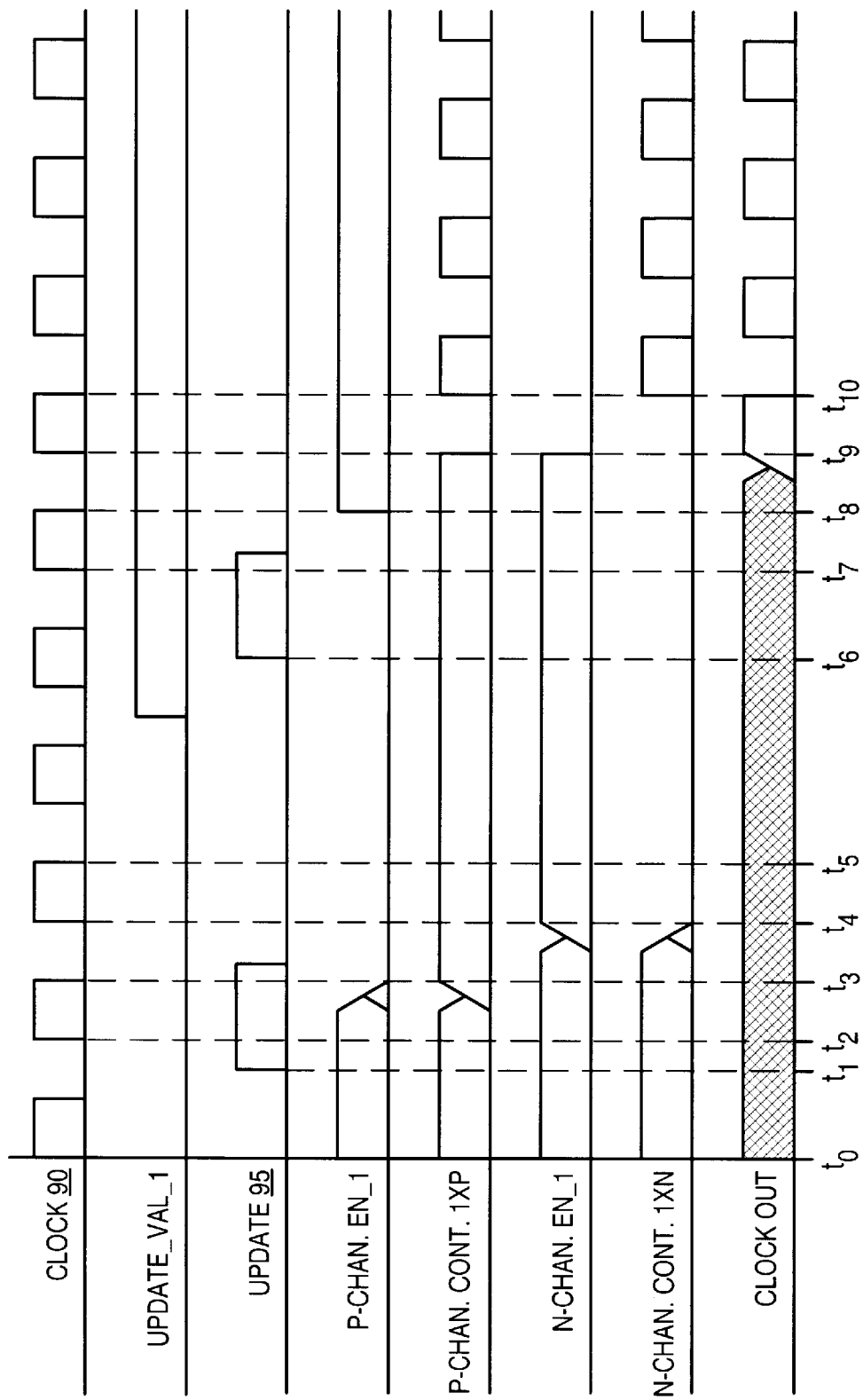
FIG. 4 is a timing diagram of one embodiment of the driver control circuit of FIG. 3.

Turning to FIG. 4, a timing diagram of one embodiment of the driver control circuit of FIG. 3 is shown. The timing diagram illustrates the timing relationship between various signals within driver control circuit 75 of FIG. 3 and clock 90.

During operation, clock 90 is clocking at a predetermined frequency as shown in row one of FIG. 4. An update value may be stored in drive strength update register 35 of FIG. 2 by external monitoring circuitry (not shown). One of the bits of drive strength update register 35 is provided to the update_val_1 input of multiplexer M1 of FIG. 3. The output of M1 is the latched value from the output of FF1. For the condition that no driver circuit is enabled, the update value is a zero in this embodiment. Thus, a logic zero is present at the one input of M1 and shown as update_val_1 in row two of FIG. 4. When the update value is stable, Update signal 95 may be activated by external circuitry (not shown). At timing mark t1, Update signal 95 is activated. Correspondingly, multiplexer M1 of FIG. 3 is switched to select the update_val_1 input. The zero on the input is provided to the input of FF1, where upon the next rising edge of clock 90, it is latched by FF1 and fed back to the zero input of M1 as shown at timing mark t2. It is noted that this latching mechanism allows Update signal 95 to return to an inactive condition. However, It is contemplated that in other embodiments, the update value signals are stable and valid during operation and Update signal 95 and multiplexer M1 may not be necessary. It is also noted that the polarities of the signals and therefore the logic is exemplary only and that other embodiments may use other signal polarities and therefore other suitable logic functions.

The logic zero from the output of FF1 is also provided to the input of FF2 and FF3. On the next falling edge of clock 90, it is latched by FF2 as P-channel enable_1 and provided to one input of NAND-gate A1 as shown in row four of FIG. 4 at timing mark t3. Clock 90 is low during this time causing the output of NAND-gate A1 to be a logic one and therefore the P-channel portion of driver circuit 1X to be normally off. Then on the next rising edge of clock 90 at timing mark t4, since P-channel enable_1 is at a logic zero, P-channel control 1XP remains a logic one. Thus, the P-channel portion of driver circuit 1X remains off and is inhibited from turning on during the time that it would turn on if enabled.

At timing mark t4 of FIG. 4, on the rising edge of clock 90, the logic zero from the output of FF1 is latched by FF3 as N-channel enable_1 and a logic one is provided to one input of NOR-gate N1 causing the output of NOR-gate N1 to be a logic zero. In addition, clock 90 is high during this time also causing the output of NOR-gate N1 to be a logic zero and therefore the N-channel portion of driver circuit 1X to be normally off. Then on the next falling edge of clock 90 at timing mark t5, since N-channel enable_1 is at a logic one, N-channel control 1XN remains a logic zero. Thus, the N-channel portion of driver circuit 1X remains off and is inhibited from turning on during the time that it would turn on if enabled.

When the drive strength of the output is detected as needing to be changed by external circuitry (not shown), a new update value may be stored in drive strength update register 35 of FIG. 2. In the illustrated embodiment, this value is a logic one. Thus, a logic one is present at the one input of M1 and shown as update_val_1 in row two of FIG. 4. At timing mark t6, Update signal 95 is activated. Correspondingly, multiplexer M1 of FIG. 3 is switched to select the update_val_1 input. The logic one on the input is provided to the input of FF1, where upon the next rising edge of clock 90, it is latched by FF1 and fed back to the zero input of M1 as shown at timing mark t7.

The logic one from the output of FF1 is also provided to the input of FF2 and FF3. At timing mark t8 of FIG. 4, on the falling edge of clock 90, it is latched by FF2 as P-channel enable_1 and provided to one input of NAND-gate A1 thus providing an enabling condition for the P-channel transistor. However, since clock 90 is low during this time causing the output of NAND-gate A1 to be a logic one, the P-channel portion of driver circuit 1X is normally off. Then on the next rising edge of clock 90 at timing mark t9, since P-channel enable 1 is at a logic one, P-channel control 1XP transitions to a logic zero. Thus, the P-channel portion of driver circuit 1X turns on during the time that it is supposed to turn on since the enabling signal is present. As long as P-channel enable_1 is a logic one, P-channel control 1XP will continue to transition in response to clock 90 transitions which produces a corresponding clock out signal.

At timing mark t9 of FIG. 4, on the rising edge of clock 90, the logic one from the output of FF1 is latched by FF3 as N-channel enable_1 and a logic zero is provided to one input of NOR-gate N1 and thus providing an enabling condition for the N-channel transistor. However, since clock 90 is high during this time causing the output of NOR-gate N1 to be a logic zero, the N-channel portion of driver circuit 1X is normally off. Then on the next falling edge of clock 90 at timing mark t10, since N-channel enable_1 is at a logic zero, N-channel control 1XN transitions to a logic one. Thus, the N-channel portion of driver circuit 1X turns on during the time that it is supposed to turn on since the enabling signal is present. As long as N-channel enable_1 is a logic zero, N-channel control 1XN will continue to transition in response to clock 90 transitions which produces a corresponding clock out signal.

The additional drivers and their corresponding control circuits illustrated in FIG. 3 operate as described above and with substantially the same timing as shown in FIG. 4. Thus to further increase or decrease the drive strength of output driver stage 80 of FIG. 3, a new update value may be provided to driver control circuit 75. The new value may cause any driver circuit to be enabled or disabled during that portion of a clock cycle when the respective P-channel and N-channel transistor of that driver circuit are normally off.

Numerous variations and modifications will become apparent to those skilled in the art once the above disclosure is fully appreciated. It is intended that the following claims be interpreted to embrace all such variations and modifications.

What is claimed is:

1. A circuit for varying the drive strength of an output signal, said circuit comprising:
   an output driver stage including a driver circuit, wherein said driver circuit is configured to be selectively enabled depending upon an input drive strength update value signal;
   wherein said driver circuit includes a P-channel and an N-channel transistor;
   wherein said P-channel transistor has a P input which is controlled by a P-channel control signal and said N-channel transistor has an N input which is controlled by an N-channel control signal;
   a drive strength control circuit coupled to said output driver stage and configured to generate said respective P-channel and said N-channel control signals, wherein said P-channel control signal is dependent upon an input signal and a P-channel enable signal, and wherein said N-channel control signal is dependent upon said input signal and an N-channel enable signal;
   wherein said P-channel enable signal is derived from said drive strength update value signal, and wherein said P-channel control signal is prevented from changing in response to a change in said drive strength update value signal while said P-channel transistor is turned on;
   wherein said N-channel enable signal is derived from said drive strength update value signal, and wherein said N-channel control signal is prevented from changing in response to a change in said drive strength update value signal while said N-channel transistor is turned on.

2. The circuit as recited in claim 1, wherein said P-channel enable signal is dependent upon an output of a first storage element.

3. The circuit as recited in claim 1, wherein said N-channel enable signal is dependent upon an output of a second storage element.

4. The circuit as recited in claim 1, wherein said P-channel enable signal is updated in response to a first transition of said input signal and said N-channel enable signal is updated in response to a second transition of said input signal.

5. The circuit as recited in claim 4, wherein said first transition of said input signal is a one to zero transition of said input signal.

6. The circuit as recited in claim 4, wherein said second transition of said input signal is a zero to one transition of said input signal.

7. The circuit as recited in claim 4, wherein said first transition of said input signal is a one to zero transition of said input signal.

8. The circuit as recited in claim 4, wherein said second transition of said input signal is a zero to one transition of said input signal.

9. The circuit as recited in claim 1, wherein said output driver stage further comprises an additional driver circuit including a second P-channel transistor and a second N-channel transistor, wherein said additional driver circuit is coupled in parallel to said driver circuit and is configured to be selectively enabled depending upon said drive strength update value signal.

10. The circuit as recited in claim 9, wherein said second P-channel transistor has a P input which is controlled by a second P-channel control- signal and said second N-channel transistor has an N input which is controlled by a second N-channel control signal.

11. The circuit as recited in claim 10, wherein said drive strength control circuit is further configured to generate said respective second P-channel and said second N-channel control signals, wherein said second P-channel control signal is dependent upon said input signal and a second P-channel enable signal, and wherein said second N-channel control signal is dependent upon said input signal and a second N-channel enable signal.

12. The circuit as recited in claim 11, wherein said second P-channel enable signal is derived from an additional drive strength update value signal, and wherein said second P-channel control signal is prevented from changing in response to a change in said drive strength update value signal while said second P-channel transistor is turned on; and wherein said second N-channel enable signal is derived from said additional drive strength update value signal, and wherein said second N-channel control signal is prevented from changing in response to a change in said additional drive strength update value signal while said second N-channel transistor is turned on.

13. The circuit as recited in claim 1, wherein said output driver stage further comprises a plurality of additional driver circuits, wherein each of said plurality of additional driver circuits includes a P-channel transistor and an N-channel transistor, wherein each of said plurality of additional driver circuits is coupled in parallel to said driver circuit, and wherein each of said plurality of additional driver circuits is configured to be selectively enabled depending upon said drive strength update value signal.

14. The circuit as recited in claim 13, wherein said plurality of additional P-channel transistors are controlled by a plurality of additional P-channel control signals and said plurality of additional N-channel transistors are controlled by a plurality of additional N-channel control signals.

15. The circuit as recited in claim 14, wherein said drive strength control circuit is further configured to generate said plurality of additional P-channel and said plurality of additional N-channel control signals, wherein said plurality of additional P-channel control signals are dependent upon said input signal and a plurality of additional P-channel enable signals, and wherein said plurality of additional N-channel control signals are dependent upon said input signal and a plurality of additional N-channel enable signals.

16. The circuit as recited in claim 15, wherein each of said plurality of additional P-channel enable signals is derived from a plurality of respective additional drive strength update value signals, and wherein said plurality of additional P-channel control signals are prevented from changing in response to a change in said respective additional drive strength update value signals while said plurality of additional P-channel transistors are turned on; and wherein each of said plurality of additional N-channel enable signals is derived from said respective additional drive strength update value signals, and wherein said plurality of additional N-channel control signals are prevented from changing in response to a change in said respective additional drive strength update value signals while said plurality of additional N-channel transistors are turned on.

17. The circuit as recited in claim 16, wherein said plurality of additional P-channel enable signals are updated in response to a first transition of said input signal and said plurality of additional N-channel enable signals are updated in response to a second transition of said input signal.

18. The circuit as recited in claim 17, wherein said first transition of said input signal is a one to zero transition of said input signal.

19. The circuit as recited in claim 17, wherein said second transition of said input signal is a zero to one transition of said input signal.

20. The circuit as recited in claim 17, wherein said first transition of said input signal is a one to zero transition of said input signal.

21. The circuit as recited in claim 17, wherein said second transition of said input signal is a zero to one transition of said input signal.

* * * * *